(12) United States Patent
Tsukamoto

(10) Patent No.: US 6,188,123 B1
(45) Date of Patent: *Feb. 13, 2001

(54) SEMICONDUCTOR ELEMENT HAVING VERTICAL DISCRETE BIPOLAR TRANSISTOR AND SEMICONDUCTOR DEVICE HAVING SAME

(75) Inventor: Tatsuhiko Tsukamoto, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/035,266

(22) Filed: Mar. 5, 1998

(30) Foreign Application Priority Data

Mar. 5, 1997 (JP) .................................... 9-050534

(51) Int. Cl.[7] ...................... H01L 27/082; H01L 27/102; H01L 29/70; H01L 31/11
(52) U.S. Cl. ..................... 257/565; 257/578; 257/587; 257/584
(58) Field of Search .................... 257/565, 578, 257/587, 591, 577, 584

(56) References Cited

U.S. PATENT DOCUMENTS 5,072,274 * 12/1991 Kokado ............................... 257/565

* cited by examiner

*Primary Examiner*—Steven H. Loke
(74) *Attorney, Agent, or Firm*—Oblon, Spivak, McClelland, Maier & Neustadt, P.C.

(57) ABSTRACT

An emitter conducting portion, which comprises a $p^+$-type silicon substrate 10, $p^+$-type emitter buried region 14 and a $p^+$-type emitter leading region 20, is formed in a semiconductor element. The $p^+$-type silicon substrate 10 of the semiconductor element is die-bonded to an emitter lead ER for electrically connecting an emitter electrode E to the emitter lead ER by means of the emitter conducting portion. Thus, it is possible to dispense with an emitter bonding wire for connecting the emitter electrode E to the emitter lead ER, and it is possible to remove impedance caused by the emitter bonding wire, so that it is possible to improve the high-frequency characteristics of a semiconductor device.

20 Claims, 10 Drawing Sheets

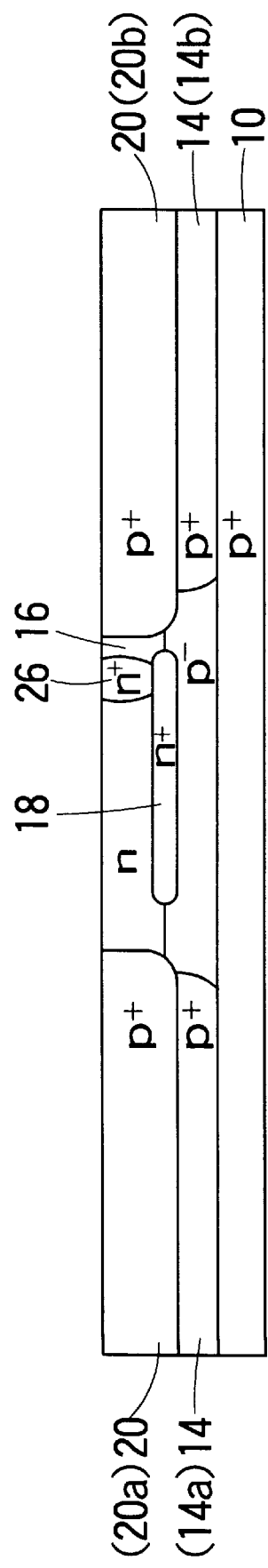
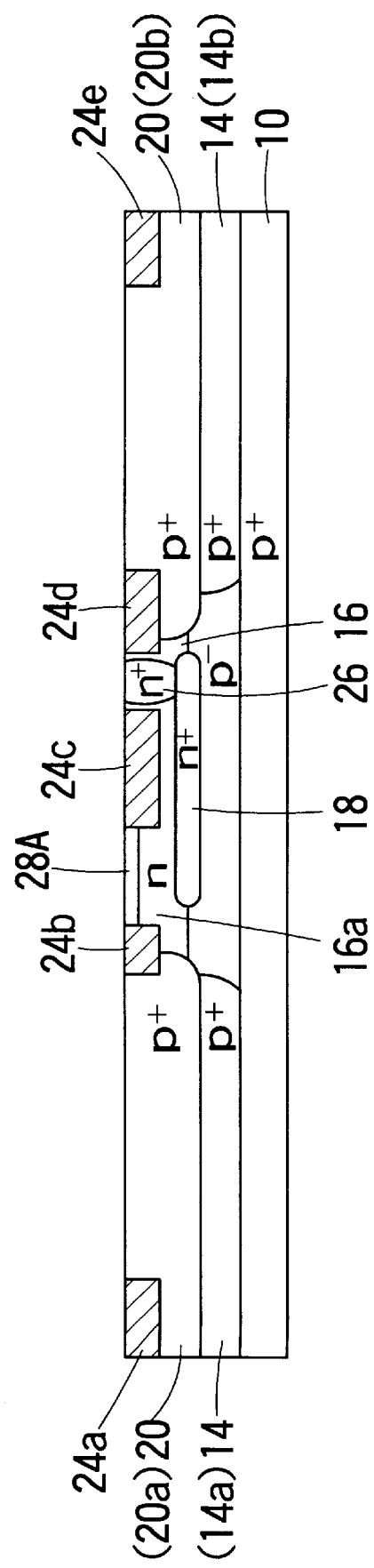

SEMICONDUCTOR ELEMENT HAVING VERTICAL DISCRETE BIPOLAR TRANSISTOR AND SEMICONDUCTOR DEVICE HAVING SAME

BACKGROUND OF THE INVENTION

1. Field of the Invention

The present invention relates generally to a semiconductor element, a semiconductor device having the semiconductor element, and methods for producing the semiconductor element and the semiconductor device. More specifically, the invention relates to a semiconductor element of a high-frequency discrete transistor, a semiconductor device, to which the semiconductor element is bonded, and methods for producing or fabricating the semiconductor element and the semiconductor device.

2. Description of the Prior Art

FIG. 13 shows a cross section of a typical discrete bipolar transistor. As shown in FIG. 13, the discrete bipolar transistor comprises base electrodes B, B and an emitter electrode E, which are formed on the surface of a semiconductor device, and a collector electrode C formed on the reverse surface of the semiconductor device. If such an npn transistor is used to amplify a high-frequency signal, there is a problem in that a collector-to-base parasitic capacity C increases, so that it is not possible to obtain sufficient high-frequency characteristics. In order to eliminate this problem, in recent years, a bipolar transistor shown in FIG. 11 has been used. In this bipolar transistor, a collector electrode C is also formed on the surface of a semiconductor device. Thus, if the collector electrode C is formed on the surface of the semiconductor device, there is an advantage in that it is possible to decrease the collector-to-base parasitic capacity C.

FIG. 11 is a schematic sectional view of a semiconductor device, to which a semiconductor element of a high-frequency npn transistor is bonded, and FIG. 12 is a plan view of the semiconductor device.

As can be seen particularly from FIG. 11, an emitter electrode E, a base electrode B and a collector electrode C are provided on the top of the npn transistor. These electrodes E, B, C are connected to an emitter lead ER, a base lead BR and a collector lead CR via an emitter bonding wire EW, a base bonding wire BW and a collector bonding wire CW, respectively. In FIG. 11, the bonding wires BW, CW and bonding pads BP, CP, which will be described later, are omitted.

More specifically, as can be seen from FIG. 12, the emitter electrode E is connected to emitter bonding pads EP, EP, the base electrode B is connected to a base bonding pad BP, and the collector electrode C is connected to a collector bonding pad CP. The emitter bonding pads EP are connected to the emitter lead ER by means of the emitter bonding wires EW. The base bonding pad BP is connected to the base lead BR by means of the base bonding wire BW. The collector bonding pad CP is connected to the collector lead CR by means of the collector bonding wire CW. One end of the base lead BR, one end of the collector lead CR, and both ends of the emitter lead ER are exposed to the outside of a package PG so as to be capable of being connected to a wiring substrate or the like.

As described above, in the conventional semiconductor device, the electrodes E, B, C of the npn transistor are connected to the lead ER, BR, CR by means of the bonding wires EW, BW, CW, respectively. However, these bonding wires EW, BW, CW have excessive impedance, which causes the deterioration of the high-frequency characteristics of the npn transistor. That is, an inductance is produced under the influence of magnetic fields caused by the bonding wires EW, BW, CW themselves, and this inductance serves as excessive impedance, which causes the deterioration of the high-frequency characteristics of the npn transistor, i.e., the deterioration of the current amplification in a high frequency band. In particular, if the npn transistor is used for an emitter grounded circuit, the influence of impedance of the emitter bonding wire EW out of the bonding wires EW, BW, CW is greatest. Also as can be seen from FIG. 12, the emitter bonding pad EP and the emitter lead ER are typically connected to each other by means of two wires. Therefore, the influence of the magnetic field cause by the emitter bonding wires EW is far greater than that of the bonding wires BW, CW.

Therefore, the emitter electrode E may be provided on the reverse surface of the semiconductor device, and the base electrode B and the collector electrode C may be provided on the surface of the semiconductor device. However, if the emitter electrode E is provided on the reverse surface of the semiconductor device, the emitter electrode E is formed on the whole reverse surface of the semiconductor device, so that the area of the emitter electrode E increases. If the area of the emitter electrode E increases, the switching takes a lot of time, so that it is not possible to enhance the high-frequency characteristics. That is, if the area between the emitter and base is large, there is a problem in that the charge and discharge for carriers take a lot of time, so that it is not possible to increase the switching rate. Therefore, in order to enhance the high-frequency characteristics, it is not desired to provide the emitter electrode E directly on the reverse surface of the semiconductor device.

SUMMARY OF THE INVENTION

It is therefore an object of the present invention to eliminate the aforementioned problems and to provide a semiconductor element, such as a high-frequency discrete npn transistor used to amplify a high-frequency signal and so forth, which has improved high-frequency characteristics without the need of emitter bonding wires EW, EW.

It is another object of the present invention to provide a semiconductor element, which has improved high-frequency characteristics by dispensing with any emitter bonding wires EW, EW to remove impedance of the emitter bonding wires EW, EW, i.e., to prevent inductance from being caused by the influence of magnetic field of the emitter bonding wires EW themselves.

It is further object of the present invention to provide a semiconductor device, which can dispense with any emitter bonding wires EW for an emitter electrodes E even if the emitter electrode E, a base electrode B and a collector electrode C are provided on the surface of the semiconductor device in order to use a discrete transistor to amplify a high-frequency signal.

It is still further object of the present invention to provide a bipolar transistor having very good high-frequency characteristics, which can remove the influence of inductance caused by emitter bonding wires EW while suppressing a collector-to-base parasitic capacity C.

In order to accomplish the aforementioned and other objects, according to one aspect of the present invention, a semiconductor element having a vertical bipolar transistor formed in a semiconductor layer formed on a semiconductor substrate, comprising: a base region formed in a part of the semiconductor layer to be exposed; a emitter region formed in a part of the base region to be exposed at a surface of the semiconductor layer; a collector region provided in the semiconductor layer which is located around the base region; a base electrode formed on an exposed surface of the base region and being electrically connected to the base region; a collector electrode formed on an exposed surface of the collector region and being electrically connected to the collector region; an emitter electrode formed on the emitter region being electrically connected to the emitter region; and an emitter conducting portion formed in part of the semiconductor substrate and semiconductor layer, for electrically connecting the emitter electrode to the semiconductor substrate, the emitter conducting portion being electrically isolated from the base region and the collector region and having a greater area than the collector region in a plane.

According to another aspect of the present invention, a semiconductor element comprises: a p-type semiconductor substrate; a p-type first semiconductor layer formed on the p-type semiconductor substrate; an n-type second semiconductor layer formed on the first semiconductor layer, a part of the n-type second semiconductor layer serving as a collector region; an emitter electrode formed on the second semiconductor layer; a collector electrode formed on the second semiconductor layer; a base electrode formed on the second semiconductor layer; a high-impurity-concentration n-type collector buried region, formed between the first semiconductor layer and the second semiconductor layer, for electrically leading the collector region; a high-impurity-concentration n-type collector leading region, formed in the second semiconductor layer, for connecting the collector electrode to the collector buried region; a p-type base region formed in a surface portion of the second semiconductor layer to be connected to the emitter electrode; an n-type emitter region formed in a surface portion of the base region to be connected to the emitter electrode; and an emitter conducting portion, formed in the semiconductor substrate and the first and second semiconductor layers, for electrically connecting the emitter electrode to the semiconductor substrate.

According to further aspect of the present invention, a semiconductor device comprising: a base lead; a collector lead; an emitter lead; and a semiconductor element formed on the emitter lead and having a vertical bipolar transistor formed in a semiconductor layer on a semiconductor substrate, the semiconductor element comprising: a base region formed in a part of the semiconductor layer to be exposed; a emitter region formed in a part of the base region to be exposed at a surface of the semiconductor layer; a collector region provided in the semiconductor layer which is located arround the base region; a base electrode formed on an exposed surface of the base region and being electrically connected to the base region; a collector electrode formed on an exposed surface of the collector region and being electrically connected to the collector region; an emitter electrode formed on the emitter region being electrically connected to the emitter region; and an emitter conducting portion formed in part of the semiconductor substrate and semiconductor layer, for electrically connecting the emitter electrode to the semiconductor substrate, the emitter conducting portion being electrically isolated from the base region and the collector region and having a greater area than the collector region in a plane.

According to still further aspect of the present invention, there is provided a method for producing a semiconductor device having a semiconductor element of a bipolar transistor, the method comprising the steps of: forming a p-type first semiconductor layer on a p-type semiconductor substrate; forming a high-impurity-concentration n-type emitter buried region in the first semiconductor layer; forming a high-impurity-concentration n-type collector buried region in the first semiconductor layer; forming an n-type second semiconductor layer on the first semiconductor layer; forming a high-impurity-concentration n-type collector leading region in the second semiconductor layer; forming a high-impurity-concentration p-type emitter leading region in the second semiconductor layer; forming a p-type base region in the second semiconductor layer; forming an n-type emitter region in the base region in the second semiconductor layer, forming a collector electrode on the second semiconductor layer to be connected to the collector leading region; forming a base electrode on the second semiconductor layer to be connected to the base region; and forming an emitter electrode on the second semiconductor layer to be connected to both the emitter region and the emitter leading region.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 5 is a sectional view illustrating a part of the process for producing the semiconductor element in the preferred embodiment;

FIG. 6 is a sectional view illustrating a part of the process for producing the semiconductor element in the preferred embodiment;

DESCRIPTION OF THE PREFERRED EMBODIMENTS

In the preferred embodiment of a semiconductor device according to the present invention, an emitter conducting portion is formed in an npn transistor, and an emitter electrode is electrically connected to an emitter lead by means of the emitter conducting portion to dispense with any emitter bonding wires.

Referring now to the accompanying drawings, particularly to FIGS. 1, 2 and 2A, the preferred embodiment of a semiconductor device according to the present invention will be described below.

Figure 1:
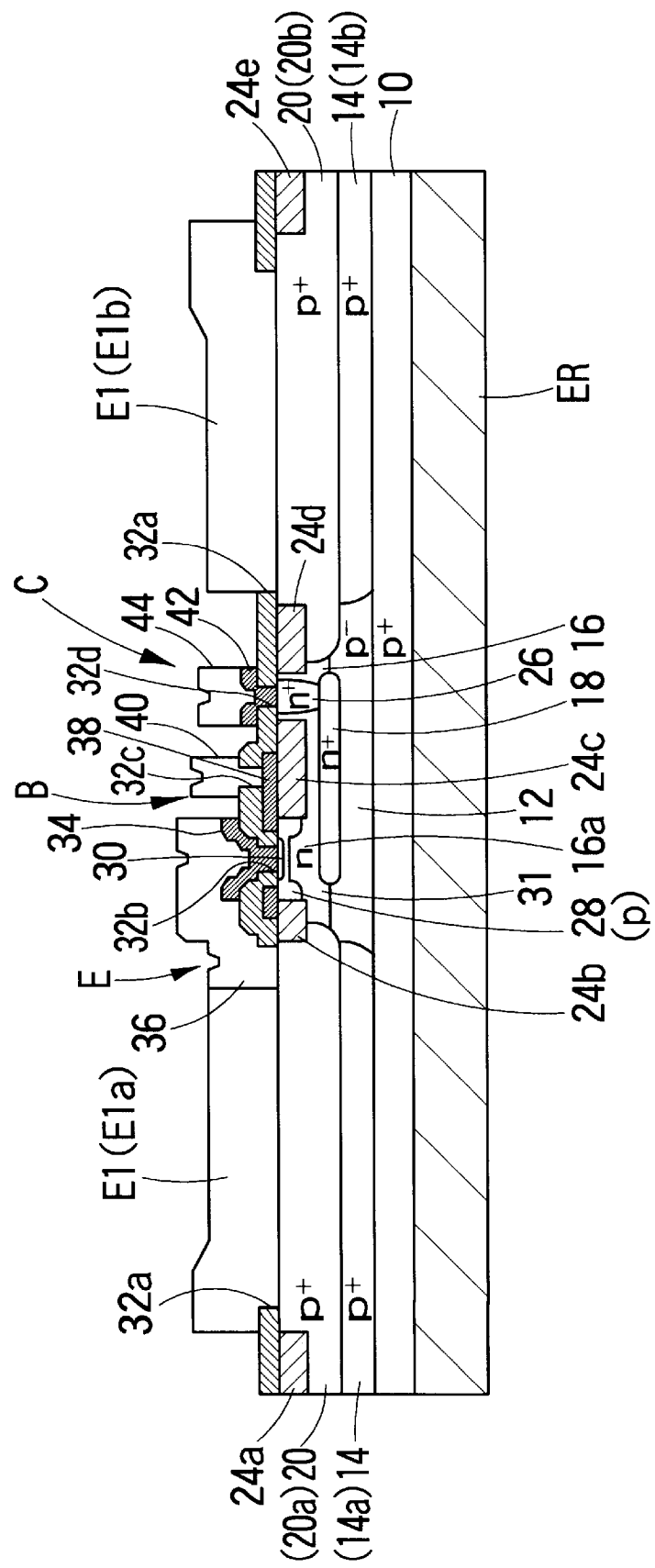
FIG. 1 is a schematic sectional view of the preferred embodiment of a semiconductor device according to the present invention.

FIG. 1 is a schematic sectional view of a semiconductor device, to which a high-frequency discrete npn transistor serving as the preferred embodiment of a semiconductor element according to the present invention is die-bonded. FIG. 2 is a schematic plan view of the semiconductor device, and FIG. 3 is a schematic plan view of the semiconductor element. In this semiconductor device, a conducting portion, which comprises a $p^+$-type silicon substrate 10, a $p^+$-type emitter buried region 14 and a $p^+$-type emitter leading region 20, is formed in the semiconductor element for electrically connecting an emitter electrode E to an emitter lead ER, to dispense with any emitter bonding wires to remove impedance of the emitter bonding wires to improve the high-frequency characteristics of the semiconductor device.

More specifically, as can be seen from FIG. 1, a low-impurity-concentration $p^-$-type first epitaxial layer 12 is formed on the high-impurity-concentration $p^+$-type silicon substrate 10. On the right and left sides of the $p^-$-type first epitaxial layer 12 in the figure, the high-impurity-concentration $p^+$-type emitter buried regions 14 are formed. As can be seen from FIG. 2A, the $p^+$-type emitter buried regions 14 are arranged at two corner portions on a diagonal of the rectangular semiconductor element and integrally formed with each other by connecting a corner portion of one of the $p^+$-type emitter buried regions 14 to a corner portion of the other $p^+$-type emitter buried region 14. These $p^+$-type emitter buried regions 14 serve as buried-area extended portions 14a, 14b.

As shown in FIG. 1, an n-type second epitaxial layer 16 is formed on the $p^-$-type first epitaxial layer 12. At the central portion of the figure, a high-impurity-concentration $n^+$-type collector buried region 18 is formed between the $p^-$-type first epitaxial layer 12 and the n-type second epitaxial layer 16. On the right and left sides of the n-type second epitaxial layer 16 in the figure, the high-impurity-concentration $p^+$-type emitter leading regions 20 are formed. As can be seen from FIG. 2A, the $p^+$-type emitter leading regions 20 are arranged at the corner portions on the diagonal of the rectangular semiconductor element and integrally formed with each other by connecting a corner portion of one of the $p^+$-type emitter leading regions 20 to a corner portion of the other $p^+$-type emitter leading region 20. These $p^+$-type emitter leading regions 20 serve as leading-area extended portions 20a, 20b.

As can be seen from FIG. 1, the $p^+$-type silicon substrate 10, the $p^+$-type emitter buried region 14 and the $p^+$-type emitter leading region 20 are associated with each other to form the emitter conducting portion for electrically connecting the emitter electrode E, which will be described later, to the emitter lead ER. On the surface of the n-type second epitaxial layer 16, field oxide films 24a through 24e are formed. On the n-type second epitaxial layer 16 between the field oxide films 24c and 24d of the field oxide films 24a through 24e, a high-impurity-concentration $n^+$-type collector leading region 26 for collector leading is formed. Between the field oxide films 24b and 24c, n-type second epitaxial layer 16 serves as a collector region 16a. On the n-type collector region 16a, a p-type base region 28 is formed, and on the side of the surface of the p-type base region 28, an n-type emitter region 30 is formed. Therefore, the portion between the field oxide films 24b and 24d serves as an element forming region 31.

On the n-type second epitaxial layer 16, an interlayer insulating film 32 having holes 32a through 32d is formed. In the hole 32b of these holes 32a through 32d, a polysilicon layer 34 is formed. On the polysilicon layer 34, a wiring layer 36 is formed. The polysilicon layer 34 and the wiring layer 36 serve as the emitter electrode E. The wiring layer 36 of the emitter electrode E extends to the left of the figure to be connected to enlarged emitter electrodes E1, which are formed on the right and left sides in FIG. 1. As can be seen from FIG. 2A, the enlarged emitter electrodes E1 are arranged at the corner portions on the diagonal of the rectangular semiconductor element and integrally formed with each other by connecting a corner portion of one of the enlarged emitter electrodes E1 to a corner portion of the other enlarged emitter electrode E1. These enlarged emitter electrodes E1 serve as emitter-electrode area extended portions E1a, E1b.

As can be seen from FIG. 1, the enlarged emitter electrode E1 and the emitter electrode E are connected to the $p^+$-type emitter leading region 20 via the hole 32a of the interlayer insulating film 32. On the upper surface of the outer peripheral portion of the p-type base region 28, a polysilicon layer 38 is formed. The polysilicon layer 38 extends to the right in the figure to be connected to the wiring layer 40 via the hole 32c of the interlayer insulating film 32. The polysilicon layer 38 and the wiring layer 40 serve as the base electrode B. In the hole 32d above the $n^+$-type collector leading region 26 on the right side in the figure, a polysilicon layer 42 is formed. On the polysilicon layer 42, a wiring layer 44 is formed. The polysilicon layer 42 and the wiring layer 44 serve as the collector electrode C. As can be seen from FIG. 2A, the base electrode B is connected to a base bonding pad BP, and the collector electrode C is connected to a collector bonding pad CP. Furthermore, a connecting wiring for connecting the collector electrode C to the collector bonding pad CP three-dimensionally intersects the enlarged emitter electrode E1, and both are electrically insulated from each other.

Figure 2:
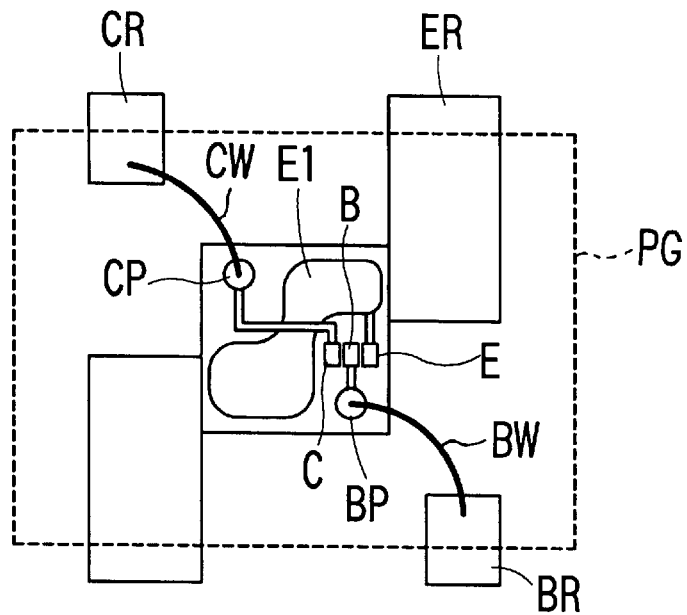
FIG. 2 is a schematic plan view of the semiconductor device in the preferred embodiment.
Figure 2A:
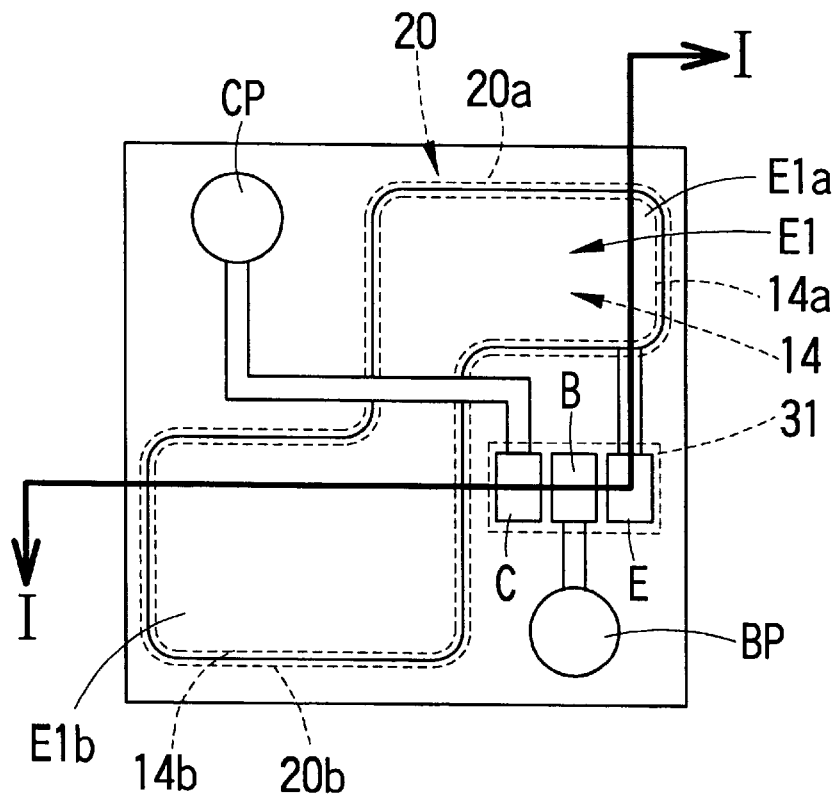
FIG. 2A is a schematic plan view of a semiconductor element in the preferred embodiment.
Figure 3:
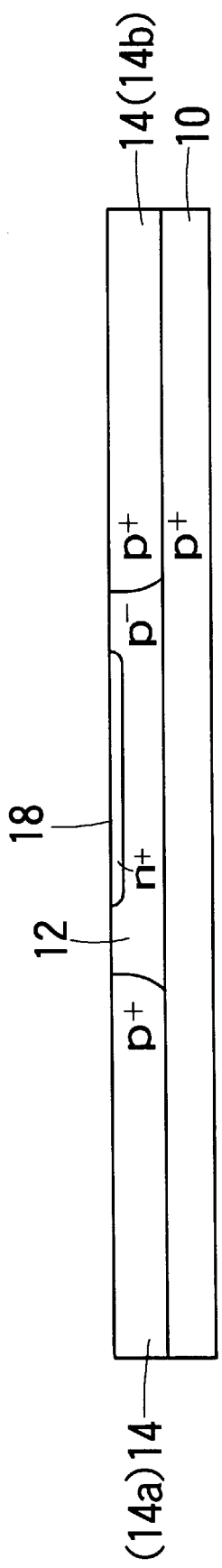
FIG. 3 is a sectional view illustrating a part of a process for producing the semiconductor element in the preferred embodiment.

Moreover, as can be seen from FIG. 2, the base electrode B is connected to a base lead BR via the base bonding pad BP by means of a base bonding wire BW, and the collector electrode C is connected to a collector lead CR via the collector bonding pad CP by means of a collector bonding wire CW. One end of each of the base lead BR and the collector lead CR is exposed to the outside of the package PG. In addition, an emitter lead ER is formed so as to obliquely cross a line extending between the base lead BR and the collector lead CR. Both ends of the emitter lead ER are exposed to the outside of the package PG. Also as can be seen from FIG. 1, the npn transistor is mounted on the emitter lead ER. That is, the $p^+$-type silicon substrate 10 of the npn transistor is die-bonded to the emitter lead ER.

Referring to FIGS. 3 through 10, a process for producing the above described semiconductor device will be described below.

First, as shown in FIG. 3, the $p^-$-type first epitaxial layer 12 is formed on the $p^+$-type silicon substrate 10 by the epitaxial growth method. Then, by the photolithography and the ion implantation, n-type impurities, such as As$^+$ and P$^+$, are selectively doped into the p$^-$-type first epitaxial layer 12 at the central portion thereof in the figure to form the n$^+$-type collector buried region 18. Similarly, by the photolithography and the ion implantation, p-type impurities, such as B$^+$, are selectively doped into the p$^-$-type first epitaxial layer 12 on the right and left sides thereof in the figure to form the p$^+$-type emitter buried region 14 so that the buried-area extended portions 14a, 14b are arranged at the corner portions thereof as described above. Then, the crystals of the p$^+$-type emitter buried region 14 and the n$^+$-type connector buried region 18 are restored by the heat treatment. Thus, an intermediate semiconductor element shown in FIG. 3 is obtained.

Figure 4:
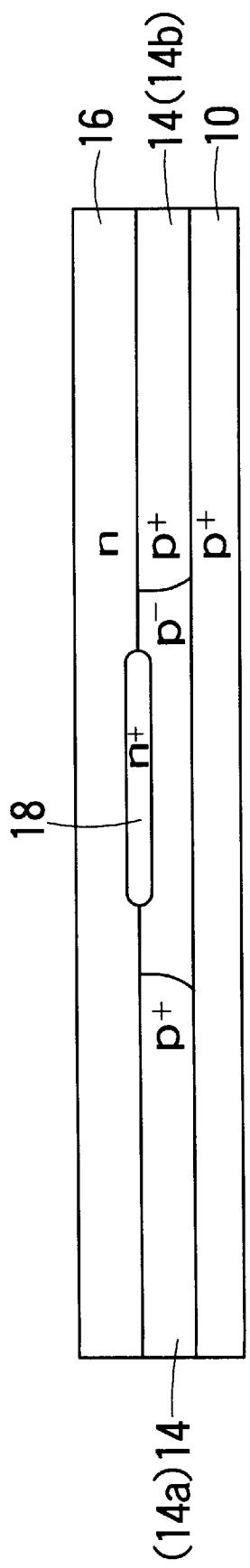
FIG. 4 is a sectional view illustrating a part of the process for producing the semiconductor element in the preferred embodiment.

Then, as shown in FIG. 4, the n-type second epitaxial layer 16 is formed on the intermediate semiconductor element of FIG. 3 by the epitaxial growth method. Thus, an intermediate semiconductor element shown in FIG. 4 is obtained.

Thereafter, as shown in FIG. 5, by the photolithography and the ion implantation, n-type impurities, such as As$^+$ and P$^+$, are doped into the n-type second epitaxial layer 16 on the right side thereof in the figure to form the n$^+$-type collector leading region 26. Similarly, by the photolithography and the ion implantation, p-type impurities, such as B$^+$, are doped into the n-type second epitaxial layer 16 on the right and left sides thereof in the figure to form the p$^+$-type emitter leading region 20 so that the leading-area extended portions 20a, 20b are arranged at the corner portions of the semiconductor element as described above. Then, the crystals of the n$^+$-type collector leading region 26 and the p$^+$-type emitter leading region 20 are restored by the heat treatment. Thus, an intermediate semiconductor element shown in FIG. 5 is obtained.

Then, as shown in FIG. 6, the field oxide films 24a through 24e of SiO$_2$ are formed by the LOCOS method. The n-type second epitaxial layer 16 serves as the n-type collector region 16a between the field oxide films 24b and 24c. Subsequently, by the photolithography and the ion implantation, p-type impurities, such as B$^+$, are doped into the n-type collector region 16a to form the p-type base region 28A. Then, the crystal of the p-type base region 28A is restored by the heat treatment. Thus, an internal semiconductor element shown in FIG. 6 is obtained.

Figure 7:
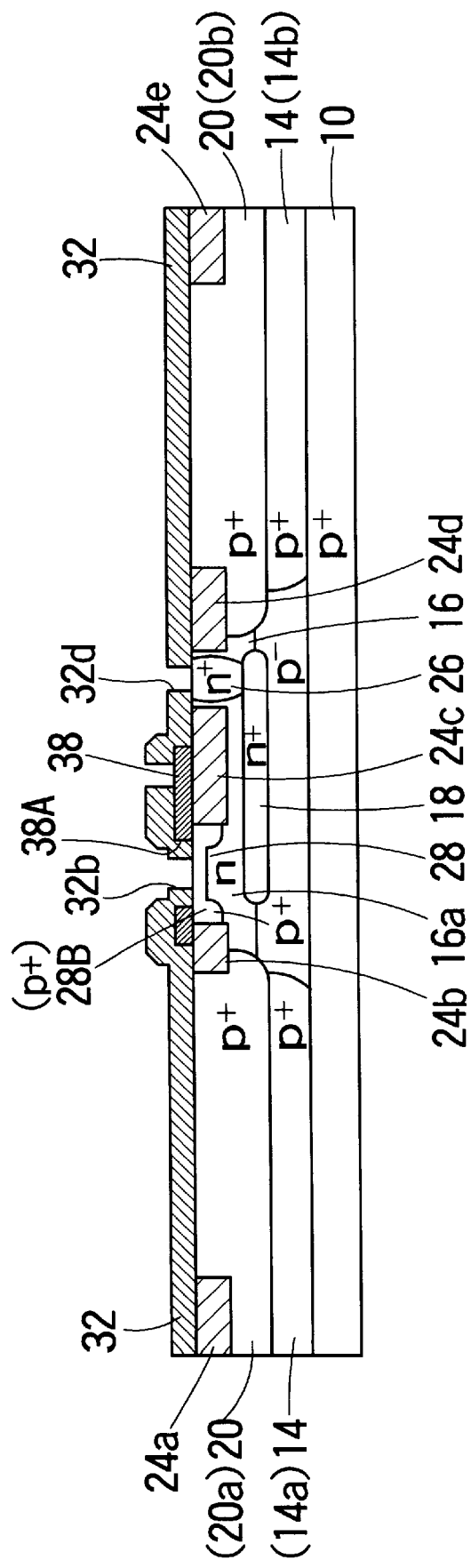
FIG. 7 is a sectional view illustrating a part of the process for producing the semiconductor element in the preferred embodiment.

Then, as shown in FIG. 7, by the LPCVD method, while p-type impurities, such as B$^+$, are doped into the intermediate semiconductor element of FIG. 6, a polysilicon film is formed. This silicon film is selectively etched by the photolithography and the RIE to form the polysilicon layer 38 so that the polysilicon layer 38 has a doughnut-shape having the hole 38A near the center thereof. Subsequently, on the semiconductor substrate thus obtained, the interlayer insulating film 32 of SiO$_2$ is formed by the heat oxidation. When this heat oxidation is performed, the p-type impurities doped into the polysilicon layer 38 are thermal-diffused to form the p-type diffusion region 28B on the outer peripheral side of the p-type base region 28A to form the p-type base region 32 having the p-type diffusion region 28B. In the interlayer insulating film 32, the holes 32b, 32d are formed by the photolithography and the RIE. Thus, the p-type base region 28 and the n$^+$-type collector leading region 26 are exposed. By these steps, an intermediate semiconductor element shown in FIG. 7 is obtained. Furthermore, the interlayer insulating film 32 may be formed by the CVD method. In this case, in order to form the p-type diffusion layer 28B of the p-type base region 28, it is required to perform additional heat treatment.

Figure 8:
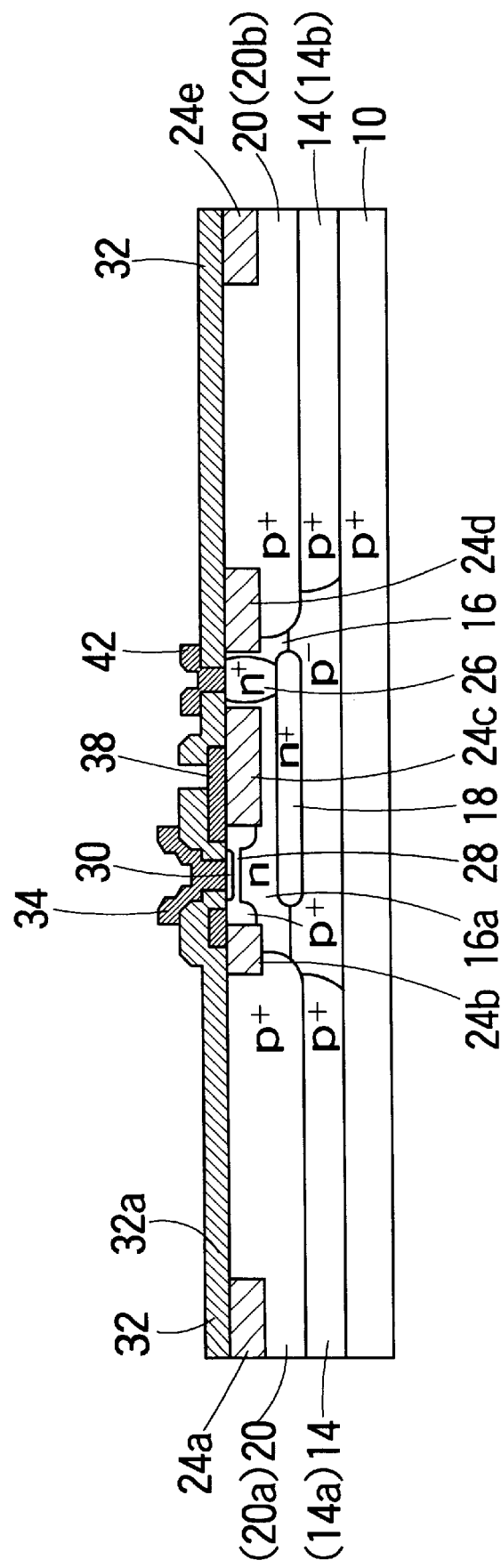
FIG. 8 is a sectional view illustrating a part of the process for producing the semiconductor element in the preferred embodiment.

Then, as shown in FIG. 8, a polysilicon film is formed while doping As or the like by the LPCVD method. The polysilicon film is selectively etched by the photolithography and the RIE to form the polysilicon layers 34, 42 in the holes 32b, 32d. Subsequently, the intermediate semiconductor element thus obtained is heat-treated, so that As or the like doped in the polysilicon layer 34 is heat-diffused to form the n-type emitter region 30. Thus, an intermediate semiconductor element shown in FIG. 8 is obtained.

Figure 9:
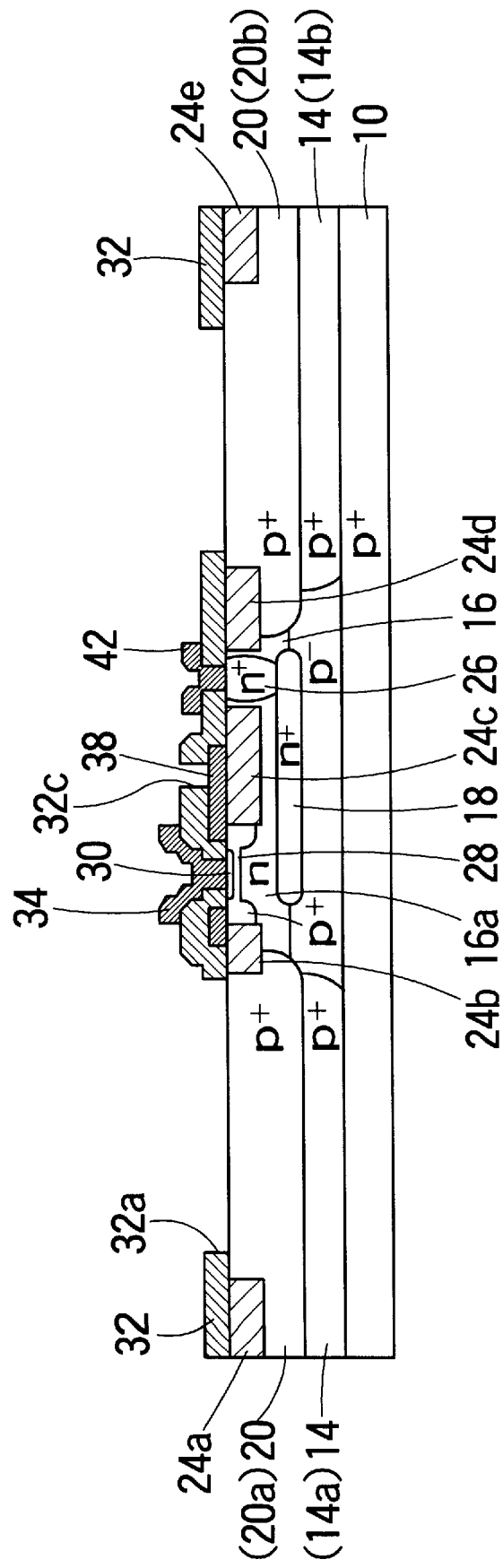
FIG. 9 is a sectional view illustrating a part of the process for producing the semiconductor element in the preferred embodiment.

Then, as shown in FIG. 9, the hole 32a is formed in the interlayer insulating film 32 so as to conform to the shapes of the leading-area extended portions 20a, 20b by the photolithography and the RIE, so that the p$^+$-type emitter leading region 20 is exposed. Thus, an intermediate semiconductor element shown in FIG. 9 is obtained.

Figure 10:
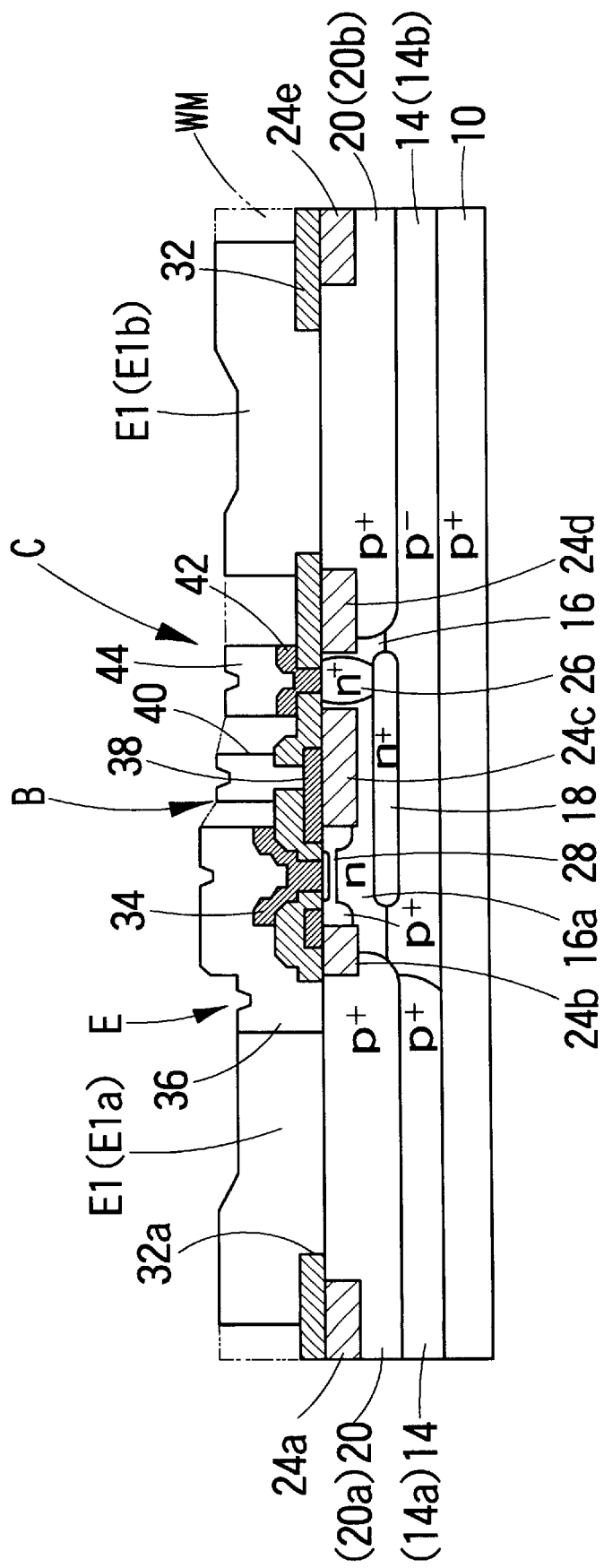
FIG. 10 is a sectional view of the semiconductor element in the preferred embodiment.
Figure 11:
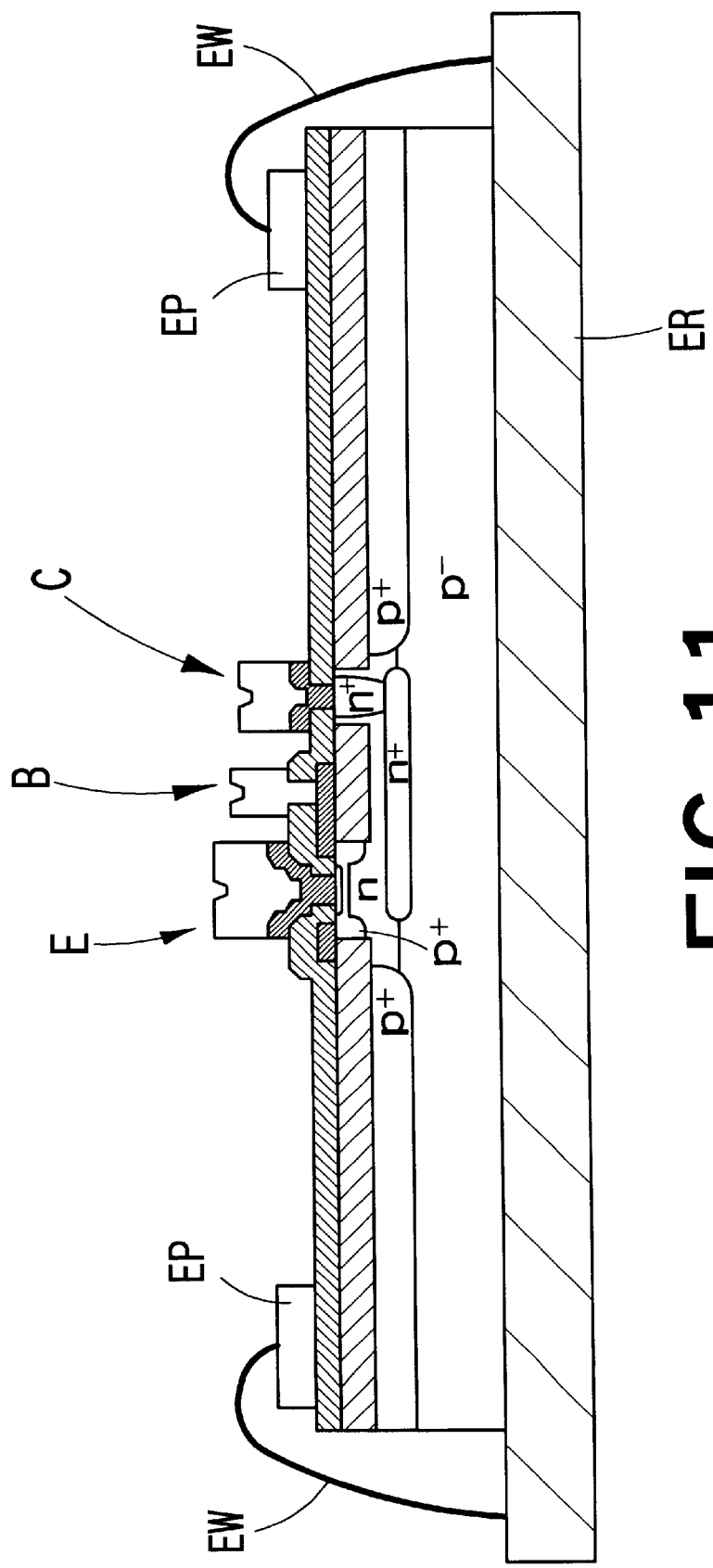
FIG. 11 is a schematic sectional view of a conventional semiconductor device.

Thereafter, as shown in FIG. 10, a wiring film WM of Al, Au or the like is formed by the sputtering. Then, the wiring film WM is selectively etched by the photolithography and the RIE to form the wiring layers 36, 40, 44 and the enlarged emitter electrode E1. The wiring layer 36 is associated with the polysilicon layer 34 to form the emitter electrode E. The wiring layer 40 is associated with the polysilicon layer 38 to form the base electrode B. The wiring layer 44 is associated with the polysilicon layer 42 to form the collector electrode C. Thus, a semiconductor element shown in FIG. 10 is obtained.

Then, as shown in FIG. 1, the semiconductor element thus obtained is mounted on the emitter lead ER. That is, the p$^+$-type silicon substrate 10 of the semiconductor element is die-bonded to the emitter lead ER. Then, as shown in FIG. 2, the base bonding pad BP is bonded to the base lead BR by means of the base bonding wire BW, and the collector bonding pad CP is bonded to the collector lead CR by means of the collector bonding wire CW. Thus, a semiconductor device shown in FIGS. 1 and 2 is obtained.

As described above, in the preferred embodiment of a semiconductor device according to the present invention, the emitter electrode E is electrically connected to the emitter lead ER by means of the emitter conducting portion, which comprises the p$^+$-type emitter leading region 20, the p$^+$-type emitter buried region 14 and the p$^+$-type silicon substrate 10, which are formed in the semiconductor element. Therefore, it is possible to dispense with any emitter bonding wires EW, which are conventionally required to connect the emitter electrode E to the emitter lead ER, so that it is possible to remove impedance of the emitter bonding wires EW. That is, it is possible to remove inductance caused by the emitter bonding wires themselves. Therefore, it is possible to improve the high-frequency characteristics, i.e., the current amplification factor in a high frequency band, of the semiconductor device using the npn transistor.

It is also possible to dispense with expensive bonding wires of Au or the like, so that it is possible to reduce the manufacturing costs.

In addition, the bottom portion of the semiconductor device, which is die-bonded to the emitter lead ER, is formed by the high-impurity-concentration p$^+$-type silicon substrate 10, which forms a part of the emitter conducting portion, so that it is possible to considerably reduce the resistance of the emitter conducting portion. Moreover, since the conducting-area extended portion, which comprises the buried-area extended portions 14a, 14b in the emitter buried region 14 and the leading-area extended portions 20a, 20b in the emitter leading region 20, is provided, it is possible to increase the area of the emitter conducting portion to decrease resistance. That is, as can be seen from FIG. 2A, since the area of the emitter conducting portion is greater than the area of the element forming region 31, it is possible to increase the conducting area to decrease resistance.

Moreover, the buried-area extended portions 14a, 14b and the leading-area extended portion 20a, 20b are provided at the corner portions on the diagonal of the rectangular semiconductor element, and the collector bonding pad CP and the base bonding pad BP are formed at the corner portions, at which the buried-area extended portions 14a, 14b and the leading-area extended portions 20a, 20b are not provided. Therefore, the bonding pads CP and BP are arranged so as to be apart from each other by the maximum distance, so that it is possible to prevent collector-to-base capacity C from being produced.

Figure 12:
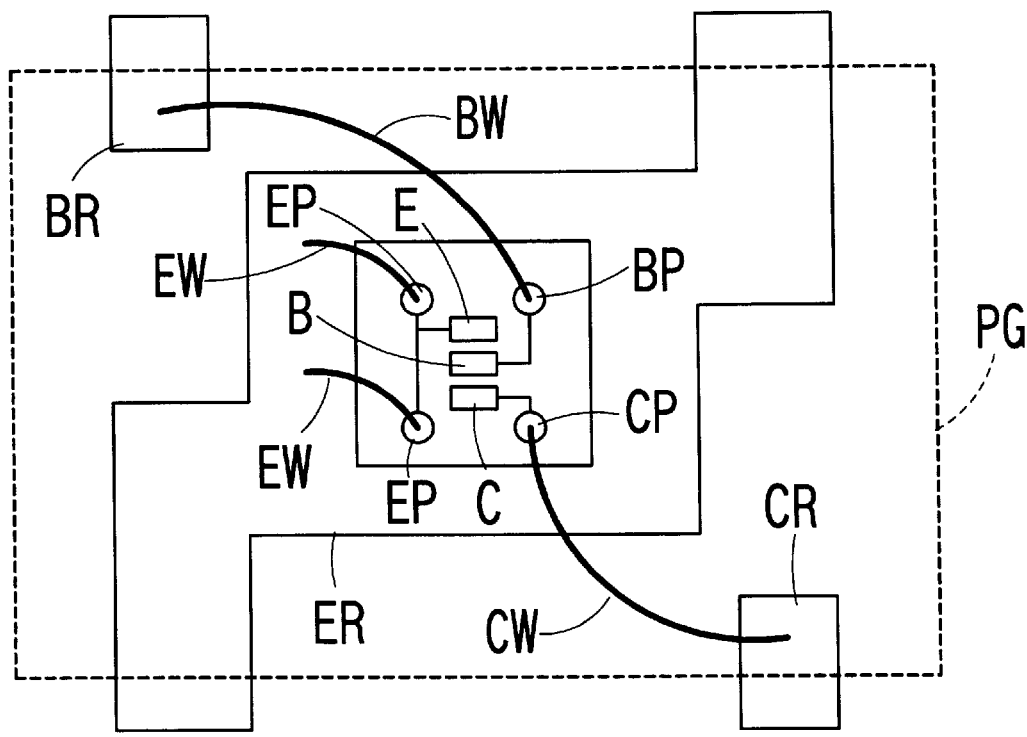
FIG. 12 is a schematic plan view of the conventional semiconductor device.
Figure 13:
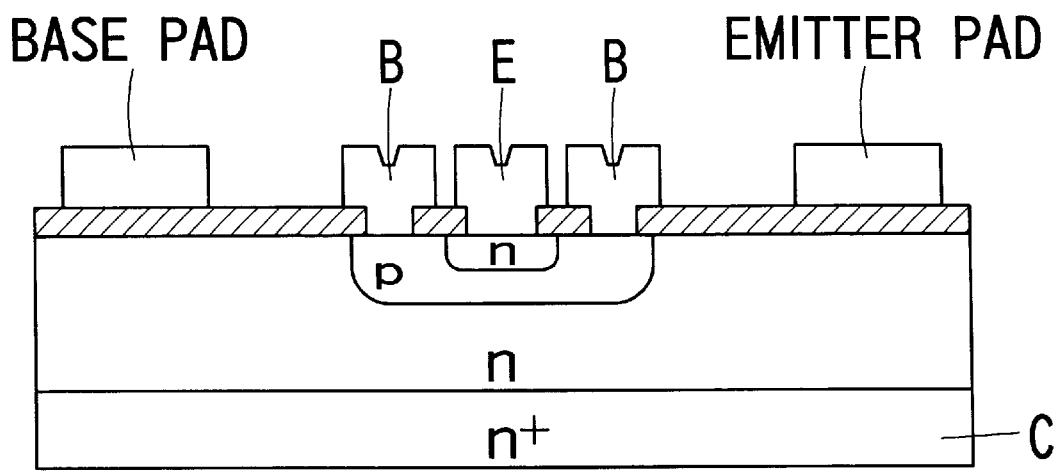
FIG. 13 is a sectional view of a bipolar transistor of a typical discrete semiconductor element.

As can be seen from the comparison of FIG. 2 with FIG. 12, since it is possible to omit the emitter bonding wire EW, it is possible to decrease the area of the emitter lead ER in comparison with conventional semiconductor devices. That is, it is not required to ensure the area for connecting the emitter bonding wire EW to the emitter lead ER, so that it is possible to decrease the area of the whole semiconductor device in comparison with conventional semiconductor devices.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims. For example, it is possible to dispense with the base bonding wire BW and/or the collector bonding wire CW without dispensing with the emitter bonding wire EW. That is, a base conducting portion may be formed in the semiconductor element to electrically connect the base electrode B to the base lead BR, or a collector conducting portion may be formed in the semiconductor element to electrically connect the collector electrode C to the collector lead CR.

According to the present invention, since a semiconductor element is electrically connected to a lead by means of a conducting portion formed in the semiconductor element to dispense with a bonding wire, it is possible to remove impedance of the bonding wire to improve the high-frequency characteristics of a semiconductor device.

What is claimed is:

1. A semiconductor element having a vertical discrete bipolar transistor formed in a first semiconductor layer formed on a second semiconductor layer formed on a semiconductor substrate, comprising:
   a base region formed in a part of said first semiconductor layer to be exposed;
   an emitter region formed in a part of said base region to be exposed at a surface of said first semiconductor layer;
   a collector region provided in said first semiconductor layer to border on said base region, at least a part of said collector region being exposed at a surface of said first semiconductor layer;
   a base electrode formed on an exposed surface of said base region and being electrically connected to said base region;
   a collector electrode formed on an exposed surface of said collector region and being electrically connected to said collector region;
   an emitter electrode formed on an exposed surface of said emitter region and being electrically connected to said emitter region, said emitter electrode having a wiring layer;
   an emitter conducting portion formed of a part of said first and second semiconductor layers and substantially the whole semiconductor substrate, for electrically connecting said emitter electrode to said semiconductor substrate, said emitter conducting portion being electrically isolated from said base region and said collector region and an area of said emitter conducting portion being greater than that of said collector region in a top plan view; and
   an enlarged emitter electrode formed with a same layer as said wiring layer of said emitter electrode, said enlarged emitter electrode directly connecting said wiring layer of said emitter electrode to said emitter conducting portion.

2. A semiconductor element according to claim 1, wherein said emitter electrode is connected to an emitter lead by said emitter conducting portion without a bonding wire.

3. A semiconductor element according to claim 1, wherein said semiconductor element has a plane rectangular shape having first, second, third and fourth corner portions, and which further comprises:
   a collector bonding pad arranged at said first corner portion of said semiconductor element, to be connected to said collector electrode; and
   a base bonding pad arranged at said second corner portion, which is arranged at the opposite angle portion to said first corner portion of said semiconductor element, to be connected to said base electrode.

4. A semiconductor element according to claim 3, wherein said part of said first and second semiconductor layers of said emitter conducting portion is arranged so as to extend between said third and fourth corner portions to cross a portion between said collector bonding pad and said base bonding pad, and wherein said part of said first and second semiconductor layers of said emitter conducting portion has two conducting-area extended portions, which extend to said third and fourth corner portions, to increase a conducting area to reduce resistance.

5. A semiconductor element according to claim 4, wherein said emitter conducting portion is electrically connected to the outside via said semiconductor substrate.

6. A semiconductor element according to claim 4, wherein said enlarged emitter electrode contacts a substantially whole exposed surface of said emitter conducting portion.

7. A semiconductor element according to claim 6, wherein said wiring layer of said emitter electrode and said enlarged emitter electrode are made of metallic material, and wherein said emitter electrode comprises a polysilicon layer connecting said wiring layer to said emitter region.

8. A semiconductor element comprising:
   a p-type semiconductor substrate;
   a p-type first semiconductor layer formed on said p-type semiconductor substrate
   an n-type second semiconductor layer formed on said first semiconductor layer, a part of said n-type second semiconductor layer serving as a collector region;
   an emitter electrode formed on said second semiconductor layer, said emitter electrode having a wiring layer;
   a collector electrode formed on said second semiconductor layer;
   a base electrode formed on said second semiconductor layer;

a high-impurity-concentration n-type collector buried region, formed between said first semiconductor layer and said second semiconductor layer, for electrically leading said collector region;

a high-impurity-concentration n-type collector leading region, formed in said second semiconductor layer, for connecting said collector electrode to said collector buried region;

a p-type base region formed in a surface portion of said second semiconductor layer to be connected to said base electrode;

an n-type emitter region formed in a surface portion of said base region to be connected to said emitter electrode;

a p-type emitter conducting portion formed of a part of said first and second semiconductor layers and substantially the whole semiconductor substrate, for electrically connecting said emitter electrode to said semiconductor substrate, said emitter conducting portion being electrically isolated from said base region and said collector region and having a greater planar area than that of said collector region; and an enlarged emitter electrode formed with the same layer as said wiring layer of said emitter electrode, said enlarged emitter electrode directly connecting said wiring layer of said emitter electrode to said emitter conducting portion.

9. A semiconductor element according to claim 6, wherein said semiconductor element has a plane rectangular shape having first, second, third and fourth corner portions, and which further comprises:

a collector bonding pad arranged at said first corner portion of said semiconductor element to be connected to said collector electrode; and a base bonding pad arranged at said second corner portion, which is arranged at the opposite angle portion to said first corner portion of said semiconductor element, to be connected to said base electrode.

10. A semiconductor element according to claim 9, wherein said part of said first and second semiconductor layers of said emitter conducting portion is arranged so as to extend between said third and fourth corner portions to cross a portion between said collector bonding pad and said base bonding pad, and wherein said part of said first and second semiconductor layers of said emitter conducting portion has two conducting-area extended portions, which extend to said third and fourth corner portions, to increase a conducting area to reduce resistance.

11. A semiconductor element according to claim 8, wherein said emitter conducting portion is electrically connected to the outside via said semiconductor substrate.

12. A semiconductor element according to claim 8, wherein said emitter electrode includes a polysilicon layer electrically connected to said emitter region, and said wiring layer formed on said polysilicon layer, one end of said wiring layer being electrically connected to said emitter conducting portion.

13. A semiconductor element according to claim 8, wherein said enlarged emitter electrode contacts a substantially whole exposed surface of said emitter conducting portion.

14. A semiconductor element according to claim 13, wherein said wiring layer of said emitter electrode and said enlarged emitter electrode are made of metallic material, and wherein said emitter electrode comprises a polysilicon layer connecting said wiring layer to said emitter region.

15. A semiconductor device comprising:

a base lead;

a collector lead;

an emitter lead; and a semiconductor element formed on said emitter lead and having a vertical discrete bipolar transistor formed in a first semiconductor layer formed on a second semiconductor layer formed on a semiconductor substrate, comprising:

a base region formed in a part of said first semiconductor layer to be exposed;

an emitter region formed in a part of said base region to be exposed at a surface of said first semiconductor layer;

a collector region provided in said first semiconductor layer to border on said base region, at least a part of said collector region being exposed at a surface of said first semiconductor layer;

a base electrode formed on an exposed surface of said base region and being electrically connected to said base region;

a collector electrode formed on an exposed surface of said collector region and being electrically connected to said collector region;

an emitter electrode formed on an exposed surface of said emitter region and being electrically connected to said emitter region, said emitter electrode having a wiring layer;

an emitter conducting portion formed of a part of said first and second semiconductor layers and substantially the whole semiconductor substrate, for electrically connecting said emitter electrode to said semiconductor substrate, said emitter conducting portion being electrically isolated from said base region and an area of said emitter conducting portion being greater than that of said collector region in a top plan view; and an enlarged emitter electrode formed with the same layer as said wiring layer of said emitter electrode, said enlarged emitter electrode directly connecting said wiring layer of said emitter electrode to said emitter conducting portion.

16. A semiconductor device according to claim 15, wherein said semiconductor element has a plane rectangular shape having first, second, third and fourth corner portions, and which further comprises:

a collector bonding pad arranged at said first corner portion of said semiconductor element to be connected to said collector electrode; and a base bonding pad arranged at said second corner portion, which is arranged at the opposite angle portion to said first corner portion of said semiconductor element, to be connected to said base electrode.

17. A semiconductor device according to claim 16, which further comprises:

a collector bonding wire for connecting said collector bonding pad to said collector lead; and a base bonding wire for connecting said base bonding pad to said base lead.

18. A semiconductor device according to claim 17, wherein said part of said first and second semiconductor layers of said emitter conducting portion is arranged so as to extend between said third and fourth corner portions to cross a portion between said collector bonding pad and said base bonding pad, and wherein said part of said first and second semiconductor layers of said emitter conducting portion has two conducting-area extended portions, which extend to said third and fourth corner portions, to increase a conducting area to reduce resistance.

19. A semiconductor element according to claim 15, wherein said enlarged emitter electrode contacts a substantially whole exposed surface of said emitter conducting portion.

20. A semiconductor element according to claim 19, wherein said wiring layer of said emitter electrode and said enlarged emitter electrode are made of metallic material, and wherein said emitter electrode comprises a polysilicon layer connecting said wiring layer to said emitter region.

* * * * *